(12) United States Patent
Chen et al.

(10) Patent No.: US 12,532,769 B2
(45) Date of Patent: Jan. 20, 2026

(54) PACKAGE SUBSTRATE BASED ON MOLDING PROCESS AND MANUFACTURING METHOD THEREOF

(71) Applicant: Zhuhai ACCESS Semiconductor Co., Ltd, Guangdong (CN)

(72) Inventors: Xianming Chen, Guangdong (CN); Lei Feng, Guangdong (CN); Benxia Huang, Guangdong (CN); Yejie Hong, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 611 days.

(21) Appl. No.: 17/945,200

(22) Filed: Sep. 15, 2022

(65) Prior Publication Data
US 2023/0092164 A1    Mar. 23, 2023

(30) Foreign Application Priority Data
Sep. 17, 2021    (CN) .......................... 202111093590.3

(51) Int. Cl.
*H01L 23/31*    (2006.01)
*H01L 21/56*    (2006.01)
(Continued)

(52) U.S. Cl.
CPC ........ *H01L 23/3121* (2013.01); *H01L 21/568* (2013.01); *H01L 23/49568* (2013.01);
(Continued)

(58) Field of Classification Search
CPC ............... H01L 23/3121; H01L 21/568; H01L 23/49568; H01L 23/49838; H01L 24/19; H01L 24/20; H01L 24/29; H01L 24/32; H01L 24/73; H01L 24/83; H01L 23/293; H01L 2224/19; H01L 2224/211; H01L 2224/214; H01L 2224/29339; H01L 2224/32245; H01L 2224/73267; H01L 2224/83192; H01L 21/561; H01L 21/565; H01L 2221/68345; H01L 23/3677;
(Continued)

(56) References Cited

U.S. PATENT DOCUMENTS

2010/0059876 A1* 3/2010 Shimizu ................. H05K 1/186
257/E21.511
2020/0013721 A1* 1/2020 Chiang ............... H01L 21/6835

FOREIGN PATENT DOCUMENTS

CN    104332414 A    2/2015
CN    105679682 A    6/2016

\* cited by examiner

*Primary Examiner* — Patricia D Valenzuela
(74) *Attorney, Agent, or Firm* — The PL Law Group, PLLC (57) ABSTRACT

A package substrate based on a molding process may include an encapsulation layer, a support frame located in the encapsulation layer, a base, a device located on an upper surface of the base, a copper boss located on a lower surface of the base, a conductive copper pillar layer penetrating the encapsulation layer in the height direction, and a first circuit layer and a second circuit layer over and under the encapsulation layer. The second circuit layer includes a second conductive circuit and a heat dissipation circuit, the first circuit layer and the second conductive circuit are connected conductively through the conductive copper pillar layer, the heat dissipation circuit is connected to one side of the device through the copper boss and the base, and the first circuit layer is connected to the other side of the device.

16 Claims, 7 Drawing Sheets

(51) Int. Cl.
*H01L 23/00* (2006.01)
*H01L 23/495* (2006.01)
*H01L 23/498* (2006.01)
*H01L 23/29* (2006.01)

(52) U.S. Cl.
CPC ........ *H01L 23/49838* (2013.01); *H01L 24/19* (2013.01); *H01L 24/20* (2013.01); *H01L 24/29* (2013.01); *H01L 24/32* (2013.01); *H01L 24/73* (2013.01); *H01L 24/83* (2013.01); *H01L 23/293* (2013.01); *H01L 2224/19* (2013.01); *H01L 2224/211* (2013.01); *H01L 2224/214* (2013.01); *H01L 2224/29339* (2013.01); *H01L 2224/32245* (2013.01); *H01L 2224/73267* (2013.01); *H01L 2224/83192* (2013.01)

(58) Field of Classification Search
CPC ......... H01L 23/49827; H01L 23/49861; H01L 21/4828; H01L 21/6835; H01L 24/18; H01L 23/5389; H01L 21/486; H01L 21/4853; H01L 21/4857; H01L 23/4824; H01L 23/485; H01L 23/49811; H01L 23/49822; H01L 24/03; H01L 24/81; H01L 2224/0231; H01L 2224/02331; H01L 2224/02381; H01L 2224/81005
See application file for complete search history.

PACKAGE SUBSTRATE BASED ON MOLDING PROCESS AND MANUFACTURING METHOD THEREOF

PRIORITY

The present application claims the benefit of Chinese Patent Application No. 202111093590.3 filed on Sep. 17, 2021 at the Chinese Intellectual Property Office, the disclosures of which are incorporated by reference herein in their entirety.

BACKGROUND

1. Technical Field

The invention relates to an electronic device package structure, and specifically to a package substrate based on a molding process and a manufacturing method thereof.

2. Background of the Invention

With the development and progress of electronic technology, electronic products are evolving in the direction of shortness, lightness and thinness, and the requirements for the more and more powerful functions of electronic products, promote the package structure of electronic products to develop in the direction of high integration and miniaturization, thereby the embedded packaging of components such as chips coming into being. At the same time, the application of electronic components is also developing in the direction of high frequency and high speed, resulting in a rapid increase in heat flux density per unit area. It is well known that the performance and reliability of electronic components are relatively degraded with the increase in ambient temperature. Without the dissipation of the generated heat in time, the continuous heating of electronic components will lead to the performance degradation of products, and over time, the reliability of electronic products will also be affected. Therefore, how to reasonably optimize the design of embedded package substrates and package bodies and improve the heat dissipation performance of embedded package structures, is an important topic at present.

An embedded package substrate refers to the use of a multi-step manufacturing process to embed components into a substrate. Single-chips, multi-chips or passive components can be embedded in an organic matrix frame side by side. The embedded packaging of components such as chips has been on the rise for many years, and is still the mainstream embedded packaging method at present. However, with the rise of high-frequency and high-speed products, embedded package products have extremely high requirements for low loss and heat dissipation. The development and application of the embedded packaging method using an organic matrix as a framework has encountered a bottleneck. Even organic matrix materials with the best heat dissipation characteristics have limitations in heat dissipation characteristics, and it is very difficult to fundamentally solve the heat dissipation problem of high-frequency and high-speed embedded products.

In the prior art, a traditional embedded packaging method is to mount components such as chips in a polymer frame or Core material with a pre-arranged cavity, and to then use a plastic package material for packaging. Like the organic matrix frame with a pre-arranged cavity disclosed in Patent No. CN105679682A, after the active and passive components are pasted in the preset cavity, the packaging is realized by laminating dielectric materials. For example, the packaging method disclosed in Patent No. CN104332414A has the following disadvantages: with the rise of high-frequency and high-speed products, embedded package products have extremely high requirements for heat dissipation, even organic matrix materials with the best heat dissipation characteristics have limitations in heat dissipation characteristics, and it is impossible to fundamentally solve the heat dissipation problem of high-frequency and high-speed embedded products.

In order to improve the heat dissipation performance of embedded package structures, the solution of using a metal frame to embed components has attracted much attention recently. A cavity is pre-processed on a metal (such as copper) plate, and components such as chips are mounted in the pre-arranged cavity, and then dielectric materials are laminated for packaging. The packaging solution uses the superior heat dissipation performance of metal materials to assist chips in heat dissipation, which can solve the heat dissipation problem of high-power chips to a certain extent. However, the use of a metal frame to embed components faces the problem of conduction between top and bottom circuits. At present, a traditional method is to reserve through-hole positions when processing a metal frame, fill dielectric materials at the reserved through-hole positions when packaging components such as chips, then drill through holes at the reserved through-hole positions, and realize the conduction between top and bottom circuits after metallization. For applications where the thickness of a metal frame required for embedding is relatively large (for example, more than 200 um), due to the limitation of the processing capacity of drilling holes, the diameters of drilling holes after packaging are generally more than 200 um. Due to the limitation of the current electroplating capability, such large-diameter through holes are generally hollow conductive through holes after electroplating, and it is impossible to form solid conductive pillars, thereby affecting the electrical performance and heat dissipation performance of embedded package substrates.

SUMMARY

Embodiments of the invention provide a package substrate based on a molding process and a manufacturing method thereof, in order to solve the above technical problems. In the invention, a molding method is applied to an embedded package substrate; a temporary carrier plate with a solid conductive copper pillar layer and a first substrate with a device mounted on its base are assembled and fixed in a mold; then a package material is used for plastically packaging to form an encapsulation layer; and circuits on upper and lower surfaces of the encapsulation layer are connected through the solid conductive copper pillar layer. Technical solutions of the invention can realize the embedment and packaging of the device in the first substrate to reduce the package volume, which meets the development needs for the miniaturization of package bodies. The heat dissipation performance of the package structure is improved by connecting the first substrate and a heat dissipation circuit made of an outer layer to a backside of the device, and by using the superior heat dissipation performance of metal material, in order to meet the development needs for high heat dissipation of high frequency, high speed and high power products. A solid conductive copper pillar layer is pre-arranged on the temporary carrier plate to conduct the circuits on the upper and lower surfaces of the encapsulation layer, which solves the problem that it is difficult for a conductive hole to be processed into a solid conductive pillar in the traditional metal frame embedded packaging method. Meanwhile, the good electrical conductivity of the solid conductive copper pillar layer is used to reduce the parasitic capacitance, inductance and loss of the package body and improve the electrical performance of the package body.

A first aspect of the invention relates to a manufacturing method for a package substrate based on a molding process, comprising the following steps of:
(a) preparing a temporary carrier plate and fabricating a conductive copper pillar layer on at least one side of the temporary carrier plate;
(b) manufacturing a first substrate which includes a support frame, a base and a copper boss on the base, with through holes formed between the support frame and the base;
(c) mounting a device on the base;
(d) assembling and fixing the temporary carrier plate and the first substrate in a mold simultaneously, with the conductive copper pillar layer located in the through holes, and with a lower end surface of the conductive copper pillar layer flush with or higher than an end surface of the copper boss; and applying an encapsulation layer to plastically package the first substrate, the device and the conductive copper pillar layer;
(e) removing the mold;
(f) removing the temporary carrier plate;
(g) thinning the encapsulation layer to expose an end of the conductive copper pillar layer and the end surface of the copper boss;
(h) forming device terminal openings to expose terminals of the device; and
(i) forming respectively a first circuit layer and a second circuit layer on upper and lower surfaces of the encapsulation layer, wherein the second circuit layer includes a second conductive circuit and a heat dissipation circuit, the first circuit layer and the second conductive circuit are connected conductively through the conductive copper pillar layer, the heat dissipation circuit is connected to an invalid surface of the device through the copper boss and the base, and the first circuit layer is connected to the terminals of the device.

In some embodiments, the temporary carrier plate includes a copper clad laminate with at least one side cladded with double-layer copper foil, wherein the copper clad laminate includes a core layer, a first copper layer on a surface of the core layer, and a second copper layer on the first copper layer, and wherein the first copper layer and the second copper layer are attached together by physical lamination.

Preferably, the core layer incudes a prepreg, the first copper layer has a thickness of 18 µm, and the second copper layer has a thickness of 3 µm.

In some embodiments, the step (a) comprises:
(a1) forming a first metal seed layer on at least one side of the temporary carrier plate;
(a2) applying a first photoresist layer on the first metal seed layer, and forming a first feature pattern by exposure and development;
(a3) forming the conductive copper pillar layer by electroplating in the first feature pattern; and
(a4) removing the first photoresist layer.
Preferably, the first metal seed layer is formed by means of electroless plating or sputtering.

Preferably, The first metal seed layer includes titanium, copper, titanium-tungsten alloy or a combination thereof.

In some embodiments, the step (a) further comprises:
(a0) applying an etch barrier layer on at least one side of the temporary carrier plate.

In some embodiments, the etch barrier layer includes nickel, titanium, or a combination thereof.

In some embodiments, the step (b) comprises:
(b1) preparing a copper plate;
(b2) applying respectively a second photoresist layer and a third photoresist layer on upper and lower surfaces of the copper plate, exposing and developing the second photoresist layer to form a second feature pattern, and performing a whole plate exposure of the third photoresist layer;
(b3) forming a top surface of the base by copper reduction etching in the second feature pattern, and removing the second photoresist layer and the third photoresist layer;
(b4) applying respectively a fourth photoresist layer and a fifth photoresist layer on the upper and lower surfaces of the copper plate, performing a whole plate exposure of the fourth photoresist layer, and exposing and developing the fifth photoresist layer to form a fifth feature pattern;
(b5) forming the copper boss by copper reduction etching in the fifth feature pattern, and removing the fourth photoresist layer and the fifth photoresist layer; and
(b6) forming the through holes and the support frame by drilling and milling on both sides of the base.

In some embodiments, the step (b) comprises:
(b1') preparing a copper plate;
(b2') applying respectively a second photoresist layer and a third photoresist layer on upper and lower surfaces of the copper plate, exposing and developing the second photoresist layer to form a second feature pattern, and performing a whole plate exposure of the third photoresist layer;
(b3') forming a top surface of the base by copper reduction etching in the second feature pattern, and removing the second photoresist layer and the third photoresist layer;
(b4') applying respectively a fourth photoresist layer and a fifth photoresist layer on the upper and lower surfaces of the copper plate, performing a whole plate exposure of the fourth photoresist layer, and exposing and developing the fifth photoresist layer to form a fifth feature pattern;
(b5') forming the copper boss by copper reduction etching in the fifth feature pattern, with the copper boss located on a lower surface of the base, and removing the fourth photoresist layer and the fifth photoresist layer; and
(b6') applying respectively an eighth photoresist layer and a ninth photoresist layer on both sides of the base, forming an eighth feature pattern and a ninth feature pattern by respectively exposing and developing, and forming the through holes and the support frame by etching the exposed copper plate in the eighth feature pattern and the ninth feature pattern, so as to obtain the first substrate.

In some embodiments, the step (c) comprises: applying a viscous thermally conductive material on the base, and mounting a backside of the device on the viscous thermally conductive material to mount the device on the base.

In some embodiments, the viscous thermally conductive material is selected from at least one of thermally conductive adhesive and silver paste.

In some embodiments, the encapsulation layer is selected from at least one of epoxy resin, phenolic resin, benzocyclobutene resin, and polyesterimide resin.

In some embodiments, the step (f) includes: physically separating the first copper layer and the second copper layer and etching the second copper layer, to remove the temporary carrier plate.

In some embodiments, the step (f) further includes: etching the etch barrier layer and the first metal seed layer.

In some embodiments, the step (g) further includes: entirely thinning the encapsulation layer by grinding or plasma etching to expose the end of the conductive copper pillar layer and the end surface of the copper boss.

In some embodiments, the step (g) further includes: partially thinning the encapsulation layer by laser or drilling to expose the end of the conductive copper pillar layer and the end surface of the copper boss.

In some embodiments, the step (h) further includes: partially thinning the encapsulation layer over the terminals of the device by laser, drilling or plasma etching to form the device terminal openings to expose the terminals of the device.

In some embodiments, the step (i) includes:
(i1) forming respectively a second metal seed layer and a third metal seed layer on the upper and lower surfaces of the encapsulation layer;
(i2) applying respectively a sixth photoresist layer and a seventh photoresist layer on the second metal seed layer and the third metal seed layer, and forming a sixth feature pattern and a seventh feature pattern by exposure and development;
(i3) forming the first circuit layer and the second circuit layer by electroplating respectively in the sixth feature pattern and the seventh feature pattern; and
(i4) removing the sixth photoresist layer and the seventh photoresist layer, and etching the exposed second metal seed layer and the exposed third metal seed layer.

Preferably, the second metal seed layer and the third metal seed layer are formed by electroless plating or sputtering.

Preferably, the second metal seed layer and the third metal seed layer include respectively titanium, copper, titanium-tungsten alloy or a combination thereof.

In some embodiments, the manufacturing method further includes:
(j) after the step (i), applying a solder resist material respectively on the first circuit layer and the second circuit layer, and subjecting the exposed metal to surface treatment to form surface treatment layers.

Preferably, the solder resist material is applied on the first circuit layer and the second circuit layer by coating, film sticking or printing, and the exposed metal is subjected to surface treatment by gold, silver, gold plating or tin plating.

A second aspect of the invention provides a package substrate based on a molding process, including an encapsulation layer, a support frame located in the encapsulation layer, a base, a device located on an upper surface of the base, a copper boss located on a lower surface of the base, a conductive copper pillar layer penetrating the encapsulation layer in the height direction, and a first circuit layer and a second circuit layer over and under the encapsulation layer. The second circuit layer includes a second conductive circuit and a heat dissipation circuit, the first circuit layer and the second conductive circuit are connected conductively through the conductive copper pillar layer, the heat dissipation circuit is connected to the device through the copper boss and the base, and the first circuit layer is connected to terminals of the device.

In some embodiments, a lower end surface of the conductive copper pillar layer is flush with or higher than an end surface of the copper boss.

In some embodiments, an end of the conductive copper pillar layer is flush with or higher than the encapsulation layer, and the conductive copper pillar layer includes at least conductive copper pillar.

In some embodiments, the heat dissipation circuit is connected to a backside of the device by the copper boss and the base, and the first circuit layer is connected to the terminals of the device.

In some embodiments, the package substrate further includes a first solder resist layer and a second solder resist layer respectively formed on the first circuit layer and the second circuit layer, with a first metal surface treatment layer provided in the first solder resist layer, and with a second metal surface treatment layer provided in the second solder resist layer.

BRIEF DESCRIPTION OF THE DRAWINGS

In order to better understand the invention and illustrate embodiments of the invention, reference is made below to the accompanying drawings purely by way of example.

With specific reference to the accompanying drawings, it is necessary to emphasize that the specific illustrations are exemplary and only for purposes of illustrative discussion of preferred embodiments of the invention, and are presented for providing the illustrations which are believed to be the most useful for describing the principle and conceptual aspects of the invention and easiest to understand. In this regard, no attempt has been made to illustrate structural details of the invention in greater detail than is necessary for a basic understanding of the invention. The description with reference to the accompanying drawings will enable those skilled in the art to recognize how several forms of the invention can actually be embodied. In the figures:

FIGS. 2A to 2O show schematic cross-sectional views of intermediate structures of various steps of a manufacturing method for a package substrate based on a molding process, according to an embodiment of the invention.

DETAILED DESCRIPTION OF THE EMBODIMENTS

Figure 1:
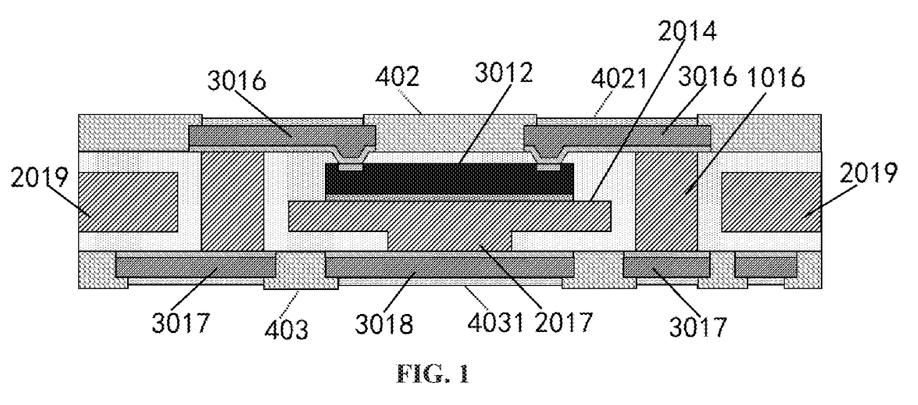
FIG. 1 is a schematic cross-sectional view of a package substrate based on a molding process, according to an embodiment of the invention.

Referring to FIG. 1, a schematic cross-sectional view of a package substrate 100 based on a molding process is shown. As shown in FIG. 1, the package substrate 100 includes an encapsulation layer 301 which can be selected from at least one of epoxy resin, phenolic resin, benzocyclobutene resin and polyesterimide resin.

In the encapsulation layer 301 is provided a support frame 2019, a base 2014, a device 3012 located on an upper surface of the base 2014, a copper boss 2017 located on a lower surface of the base 2014, and a conductive copper pillar layer 1016 penetrating the encapsulation layer 301 in the height direction. The conductive copper pillar layer 1016 can include at least one conductive copper pillar as an IO channel, which can have the same cross-sectional size or different cross-sectional sizes. The shape of the conductive copper pillar layer 1016 can be set according to actual needs, and for example, can be square, round shape, etc., which is not specifically limited. The conductive copper pillar layer 1016 has a lower end surface which can be flush with or can also be higher than an end surface of a copper boss 2017. The conductive copper pillar layer 1016 has an end which can be flush with or can also be higher than the encapsulation layer 301, which is not specifically limited.

The upper and lower surfaces of the encapsulation layer 301 are respectively provided with a first circuit layer 3016 and a second circuit layer which includes a second conductive circuit 3017 and a heat dissipation circuit 3018, and the first circuit layer 3016 and the second conductive circuit 3017 are connected conductively through the conductive copper pillar layer 1016. The heat dissipation circuit 3018 is connected to a backside of the device 3012 through the copper boss 2017 and the base 2014, which can be used for auxiliary heat dissipation. The first circuit layer 3016 is connected to terminals of the device 3012.

The package substrate 100 further includes a first solder resist layer 402 and a second solder resist layer 403 respectively formed on the first circuit layer 3016 and the second circuit layer, with a first metal surface treatment layer 4021 provided in the first solder resist layer 402, and with a second metal surface treatment layer 4031 provided in the second solder resist layer 403.

Figure 2A:
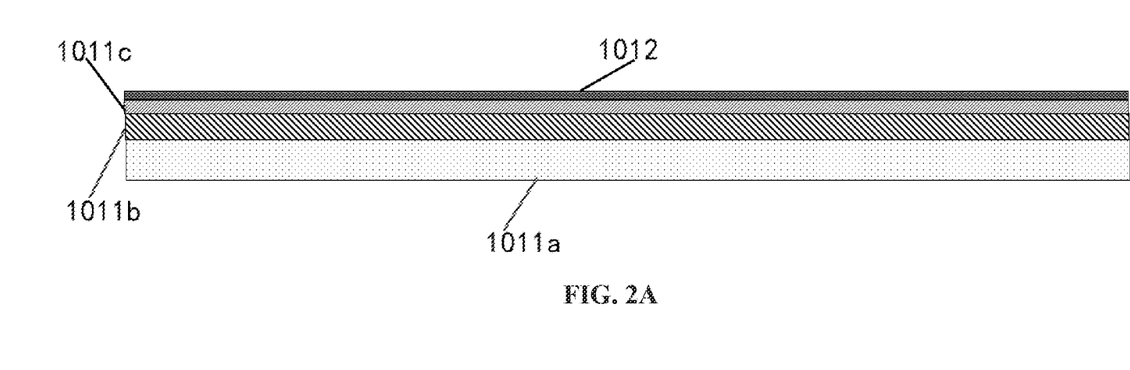

Referring to FIGS. 2A to 2O, schematic cross-sectional views of intermediate structures in various steps of a manufacturing method for a package substrate based on a molding process according to an embodiment of the invention, are shown.

The said manufacturing method includes the following step: preparing a temporary carrier plate and applying an etch barrier layer 1012 on at least one side of the temporary carrier plate—step (a), as shown in FIG. 2A. The temporary carrier plate includes a core layer 1011a which can be a prepreg. The core layer 1011a is followed in sequence outwards by a first copper layer 1011b located on a surface of the core layer 1011a, and a second copper layer 1011c located on a surface of the first copper layer 1011b. The first copper layer 1011b and the second copper layer 1011c are formed by physical lamination of copper foils, or can be physically separated to facilitate removing the temporary carrier plate in a subsequent process. The thicknesses of the first copper layer 1011b and the second copper layer 1011c can be adjusted according to actual needs, preferably, the first copper layer 1011b has a thickness of 18 µm, and the second copper layer 1011c has a thickness of 3 µm. Generally, the etch barrier layer 1012 can be applied simultaneously on both sides of the temporary carrier plate. In the embodiment, a single unit on one side of the temporary carrier plate will be demonstrated subsequently, but subsequent operations are not limited to perform only on one side of the temporary carrier plate. In the subsequent process of removing the temporary carrier plate, when the first copper layer 1011b is etched after plate separation, the etch barrier layer 1012 can protect the circuit layer and the copper pillar layer of the substrate to avoid excessive etching. The etch barrier layer 1012 can include nickel, titanium, or a combination thereof. The thickness of the etch barrier layer 1012 can be adjusted according to actual needs, and preferably, the etch barrier layer 1012 has a thickness of 3-10 µm.

Figure 2B:
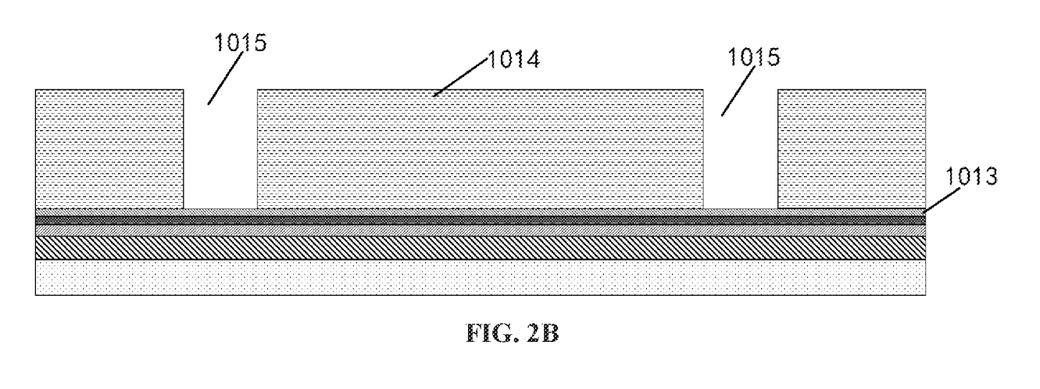

Next, a first metal seed layer 1013 is formed on the etch barrier layer 1012, a first photoresist layer 1014 is applied on the first metal seed layer 1013, and a first feature pattern is formed by exposure and development—step (b), as shown in FIG. 2B. Generally, the first metal seed layer 1013 can be formed on the etch barrier layer 1012 by means of electroless plating or sputtering, can include titanium, copper, titanium-tungsten alloy or a combination thereof, and has a thickness range of 1-3 µm. Preferably, the first metal seed layer 1013 is fabricated by sputtering titanium and copper. Generally, the first photoresist layer 1014 can be applied on the first metal seed layer 1013 by film sticking or coating. The thickness of the first photoresist layer 1014 can be adjusted as required. The first feature pattern has conductive copper pillar openings 1015 for forming the conductive copper pillar layer by electroplating in subsequent processes.

Figure 2C:
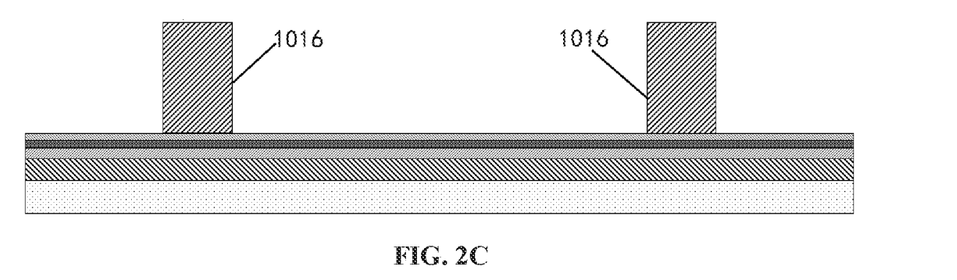

Then, the conductive copper pillar layer 1016 is formed by electroplating in the first feature pattern, and the first photoresist layer 1014 is removed—step (c), as shown in FIG. 2C. Generally, the first photoresist layer 1014 can be removed by film stripping. The conductive copper pillar layer 1016 is formed by electroplating copper in the conductive copper pillar openings 1015. The thickness of the conductive copper pillar layer 1016 can be set according to actual needs, and generally is not larger than that of the first photoresist layer 1014. After formed, the conductive copper pillar layer 1016 can be subjected to browning treatment on its surfaces, to increase the bonding force between the conductive copper pillar layer 1016 and the encapsulation layer cladding it in a subsequent process. The conductive copper pillar layer 1016 can include at least one conductive copper pillar, and can include conductive copper pillars of different sizes. The shape of the conductive copper pillar layer 1016 can be set according to actual needs, and for example, can be square, round shape, etc., which is not specifically limited. Preferably, the conductive copper pillar layer 1016 has uniform upper and lower dimensions, which is more advantageous to the heat dissipation of embedded package structures and the stability of signal transmission.

A solid conductive copper pillar layer is pre-arranged on the temporary carrier plate to conduct the circuits on the upper and lower surfaces of the encapsulation layer, which solves the problem that it is difficult for a conductive hole to be processed into a solid conductive pillar in the traditional metal frame embedded packaging method. Meanwhile, the good electrical conductivity of the solid conductive copper pillar layer is used to reduce the parasitic capacitance, inductance and loss of the package body and improve the electrical performance of the package body.

Figure 2D:
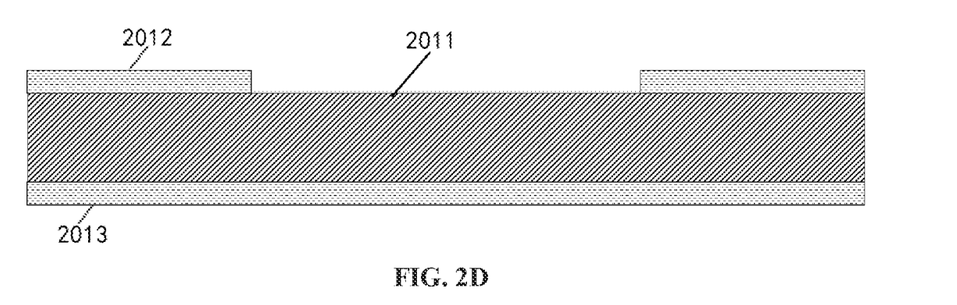

Next, a copper plate 2011 is prepared, a second photoresist layer 2012 and a third photoresist layer 2013 are applied respectively on the upper and lower surfaces of the copper plate 2011, the second photoresist layer 2012 is exposed and developed to form a second feature pattern, and a whole plate exposure is performed of the third photoresist layer 2013—step (d), as shown in FIG. 2D. Generally, the second photoresist layer 2012 and the third photoresist layer 2013 can be applied by coating or film sticking. A base area can be exposed in the second feature pattern. The whole plate exposure of the third photoresist layer 2013 can mask the entire lower surface of the copper plate 2011, which can protect the lower surface of the copper plate 2011 in a subsequent copper reduction etching process to avoid excessive etching.

Figure 2E:
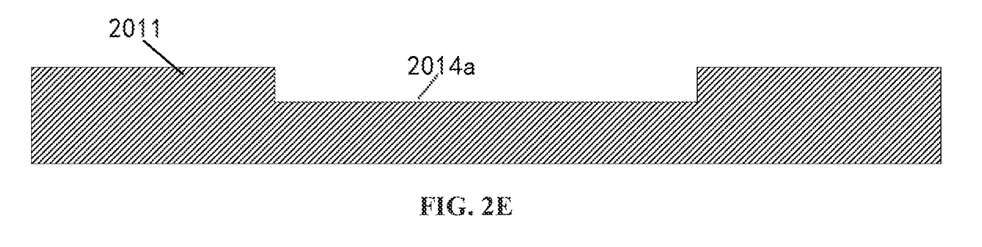

Then, a top surface 2014a of the base 2014 is formed by copper reduction etching in the second feature pattern, and the second photoresist layer 2012 and the third photoresist layer 2013 are removed—step (e), as shown in FIG. 2E. Generally, the top surface 2014a of the base 2014 can be obtained by performing the copper reduction etching on the exposed area of the second feature pattern, and the amount of the copper reduction etching can be set according to the height difference between the base and the support frame. The second photoresist layer 2012 and the third photoresist layer 2013 can be removed by film stripping.

Figure 2F:
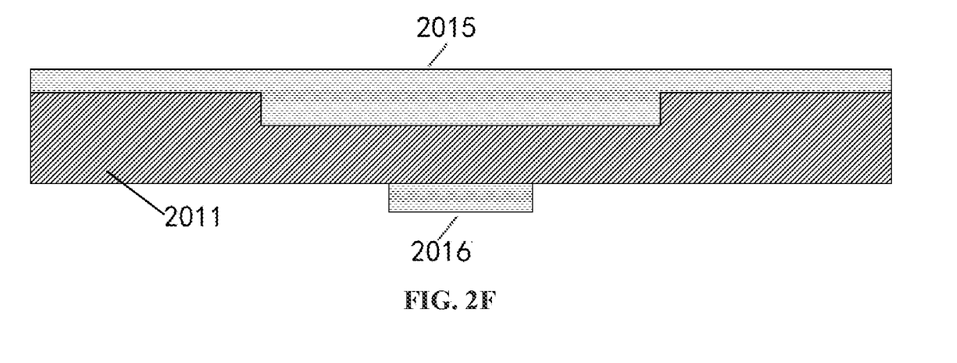

Next, a fourth photoresist layer 2015 and a fifth photoresist layer 2016 are respectively applied on the upper and lower surfaces of the copper plate 2011, the whole plate exposure is performed of the fourth photoresist layer 2015, and the fifth photoresist layer 2016 is exposed and developed to form a fifth feature pattern—step (f), as shown in FIG. 2F. Generally, the fourth photoresist layer 2015 and the fifth photoresist layer 2016 can be applied by coating or film sticking. The whole plate exposure of the fourth photoresist layer 2015 can mask the entire upper surface of the copper plate 2011, which can protect the upper surface of the copper plate 2011 in a subsequent copper reduction etching process to avoid excessive etching. The fifth feature pattern can mask the copper boss area.

Figure 2G:
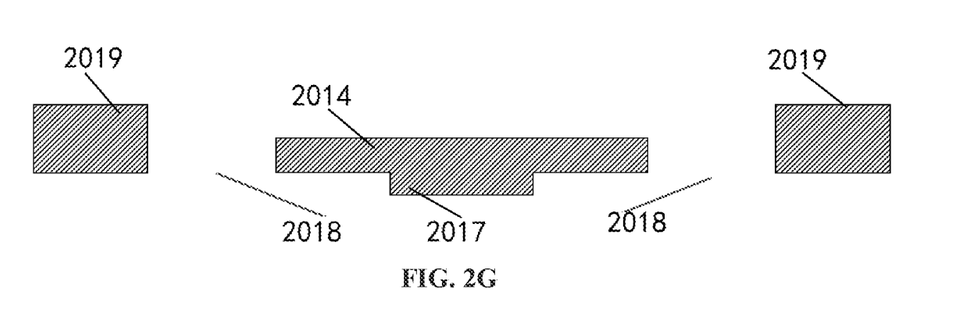

Then, the copper reduction etching is performed in the fifth feature pattern to form the copper boss 2017 located on the lower surface of the base 2014, the fourth photoresist layer 2015 and the fifth photoresist layer 2016 are removed, and both sides of the base 2014 are drilled and milled to form through holes 2018 and the supporting frame 2019, so as to obtain a first substrate—step (g), as shown in FIG. 2G. Generally, the copper boss 2017 can be obtained by performing the copper reduction etching on the exposed area of the fifth feature pattern, and the amount of the copper reduction etching can be set according to the height of the copper boss 2017. The fourth photoresist layer 2015 and the fifth photoresist layer 2016 can be removed by film stripping.

It should be explained that after the copper boss 2017 is formed by copper reduction etching, and the fourth photoresist layer 2015 and the fifth photoresist layer 2016 are removed, an eighth photoresist and a ninth photoresist layer can also be applied on both sides of the base 2014 again, feature patterns can be fabricated respectively, and the exposed copper plate 2011 is etched in the feature patterns to form the through holes 2018 and the support frame 2019.

Figure 2H:
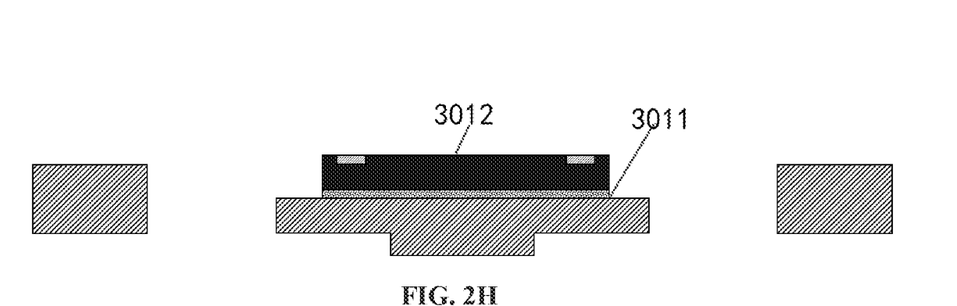

Next, a viscous thermally conductive material 3011 is applied on the base 2014, and the backside of the device 3012 is mounted on the viscous thermally conductive material 3011 to mount the device 3012 on the base 2014—step (h), as shown in FIG. 2H. Generally, the viscous thermally conductive material 3011 can be selected from at least one of thermally conductive adhesive and silver paste, and can be applied by coating, printing or dispensing. The device 3012 can be a bare chip (such as an Integrated Circuit driver chip (IC driver), a Field Effect Transistor (FET), etc.), can also be a passive device (such as a capacitor, a resistor, or an inductor, etc.), can also be a single package body after preliminary packaging (such as a Ball Grid Array (BGA)/a Land Grid Array (LGA), etc.), or a combination thereof. The device 3012 can be a device with terminals on one side, or can also be a device with terminals on both sides. For example, in the embodiment, only the device 3012 as a chip with single-sided terminals is demonstrated subsequently, but the subsequent operations are not limited to perform only on the chip with single-sided terminals.

Generally, the backside of the device 3012 can be mount on the viscous thermally conductive material 3011, and the backside of the device 3012 is fixed to the backside of the base 2014 through the viscous thermally conductive material 3011, with the front side of the device 3012 facing upward. It is possible to provide multiple devices according to actual needs and to provide the same number of bases for mounting the multiple devices. The device 3012 is embedded and packaged in the first substrate to reduce the package volume, which meets the development needs for the miniaturization of the package body.

Figure 2I:
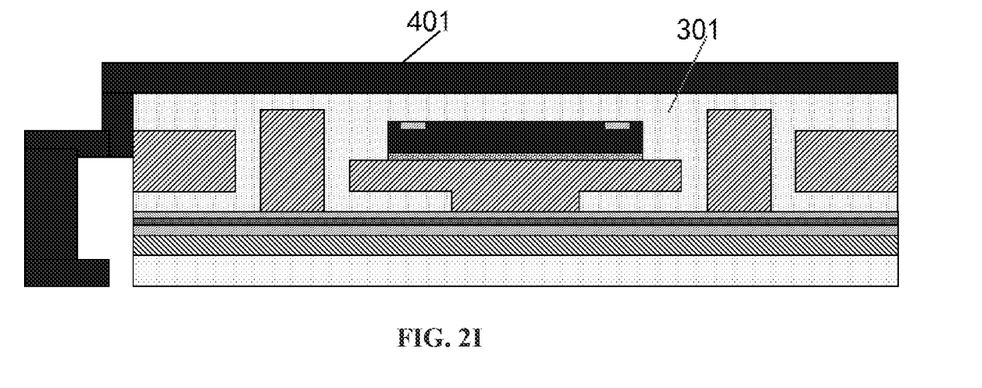

Then, the temporary carrier plate and the first substrate are assembled and fixed in a mold 401 simultaneously, with the conductive copper pillar layer 1016 located in the through holes 2018, and with the lower end surface of the conductive copper pillar layer 1016 flush with the end surface of the copper boss 2017; and the encapsulation layer 301 is applied to plastically package the first substrate, the device 3012 and the conductive copper pillar layer 1016—step (i), as shown in FIG. 2I. Generally, the encapsulation layer 301 can be selected from at least one of epoxy resin, phenolic resin, benzocyclobutene resin, and polyesterimide resin.

It should be explained that the lower end surface of the conductive copper pillar layer 1016 can also be higher than the end surface of the copper boss 2017, there can be a gap between the end surface of the copper boss 2017 and the etch barrier layer 1012, and in the subsequent packaging process, the encapsulation layer 301 can fill the gap.

Figure 2J:
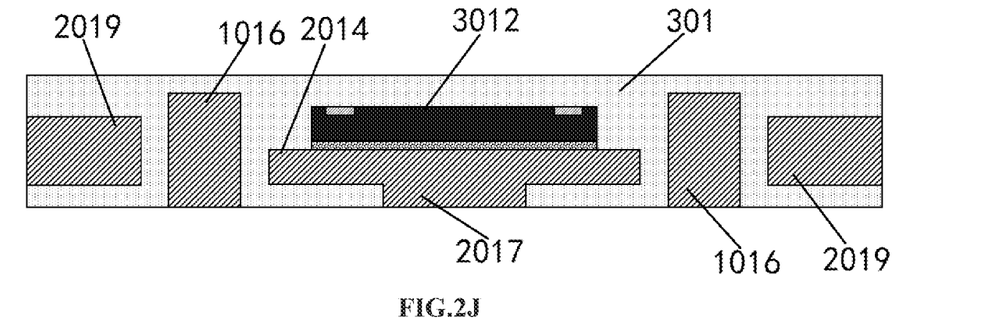

Next, the mold 401 is removed, the first copper layer 1011*b* and the second copper layer 1011*c* are separated, and the second copper layer 1011*c*, the etch barrier layer 1012 and the first metal seed layer 1013 are etched—step (j), as shown in FIG. 2J. Generally, the mold 401 can be removed after the encapsulation layer 301 is plastically packaged and cured. The etch barrier layer can be etched away by a specific portion, and for example, an etch nickel portion can be used to etch away the etch barrier layer.

Figure 2K:
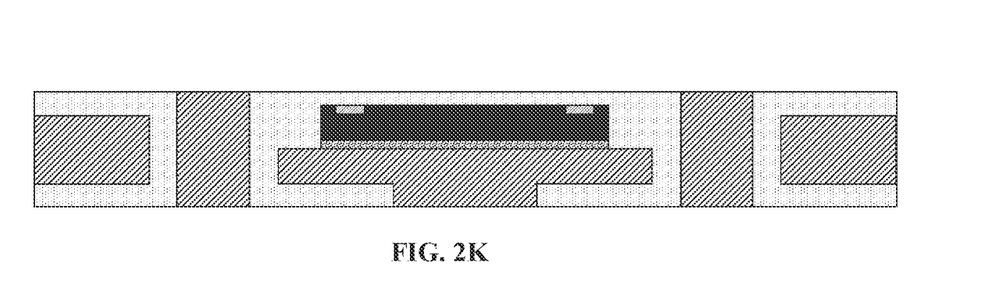

Then, the encapsulation layer 301 is thinned to expose the end of the conductive copper pillar layer 1016 and the end surface of the copper boss 2017—step (k), as shown in FIG. 2K. Generally, the encapsulation layer 301 can be entirely thinned by grinding or plasma etching to expose the end of the conductive copper pillar layer 1016, or the encapsulation layer 301 can also be partially thinned by laser or drilling to expose the end of the conductive copper pillar layer 1016. Preferably, the encapsulation layer 301 is entirely thinned by grinding or plasma etching.

Figure 2L:
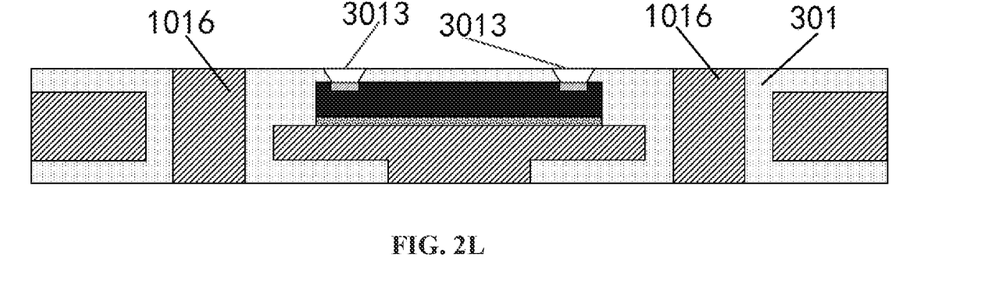

Next, the encapsulation layer 301 is partially thinned over the terminals of the device 3012 to form device terminal openings 3013 to expose the terminals of the device 3012—step (l), as shown in FIG. 2L. Generally, the encapsulation layer 301 can be partially thinned over the terminals of the device 3012 by laser, drilling or plasma etching to form device terminal openings 3013 to expose the terminals of the device 3012.

Figure 2M:
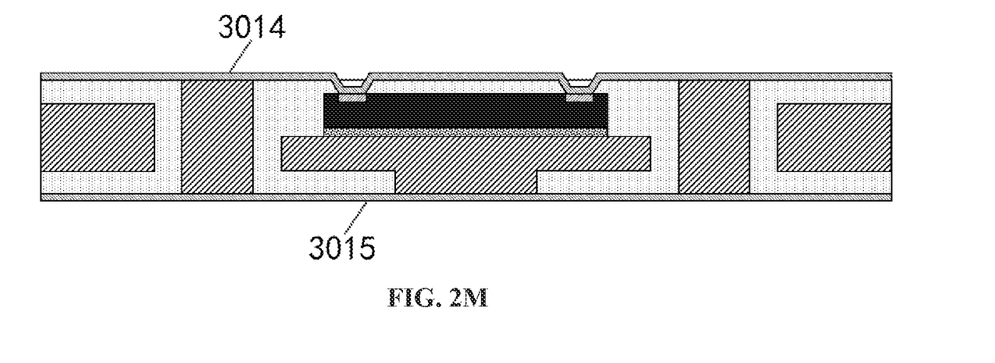

Then, a second metal seed layer 3014 and a third metal seed layer 3015 are respectively formed on the upper and lower surfaces of the encapsulation layer 301—step (m), as shown in FIG. 2M. Generally, the second metal seed layer 3014 and the third metal seed layer 3015 can be formed respectively on the upper and lower surfaces of the encapsulation layer 301 by electroless plating or sputtering, and can respectively include titanium, copper, titanium-tungsten alloys or a combination thereof. Preferably, the second metal seed layer 3014 and the third metal seed layer 3015 are respectively fabricated by sputtering titanium and copper.

Figure 2N:
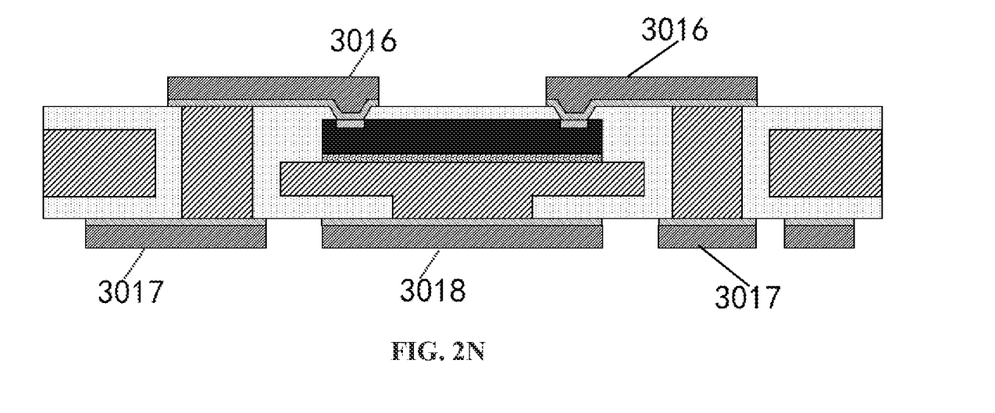

Next, a sixth photoresist layer and a seventh photoresist layer are respectively applied on the second metal seed layer 3014 and the third metal seed layer 3015, a sixth feature pattern and a seventh feature pattern are formed by exposure and development, the first circuit layer 3016 and the second circuit layer are respectively formed by electroplating in the sixth and seventh feature patterns, the sixth photoresist layer and the seventh photoresist layer are removed, and the exposed second metal seed layer 3014 and the exposed third metal seed layer 3015 are etched—step (n), as shown in FIG. 2N. Generally, the first circuit layer 3016 is connected to the terminals of the device 3012, the second circuit layer includes the second conductive circuit 3017 and the heat dissipation circuit 3018, the first circuit layer 3016 and the second conductive circuit 3017 are conducted conductively through the conductive copper pillar layer 1016, and the heat dissipation circuit 3018 is connected to the backside of the device 3012 through the copper boss 2017 and the base 2014 to assist in heat dissipation. The thicknesses of the first circuit layer and the second circuit layer can be set according to actual needs. Generally, the thickness of the first circuit layer is smaller than that of the sixth photoresist layer, and the thickness of the second circuit layer is smaller than that of the seventh photoresist layer. The sixth photoresist layer and the seventh photoresist layer can be applied by coating or film sticking, and can be removed by film stripping.

The heat dissipation performance of the package structure is improved by connecting the first substrate and the heat dissipation circuit 3018 made of the outer layer to the backside of the device 3012, and by using the superior heat dissipation performance of metal material, in order to meet the development needs for high heat dissipation of high frequency, high speed and high power products.

The embodiment only takes a double-sided plate as an example for demonstration. In practical applications, layers can be added according to actual product needs to form a multi-layer package substrate.

Finally, a solder resist material is applied respectively on the first circuit layer 3016 and the second circuit layer to form the first solder resist layer 402 and the second solder resist layer 403, the exposed metal in the first solder resist layer 402 is subjected to surface treatment to form the first metal surface treatment layer 4021, and the exposed metal in the second solder resist layer 403 is subjected to surface treatment to form the second metal surface treatment layer 4031, so as to obtain the package substrate 100—step (o), as shown in FIG. 2O. Generally, the solder resist material can be applied by coating, film sticking or printing, the solder resist layers can be formed by exposure and development, and the exposed metal can be subjected to surface treatment by gold, silver, gold plating or tin plating.

Those skilled in the art will recognize that the invention is not limited to what is specifically illustrated and described in the context. Moreover, the scope of the invention is defined by the appended claims, including combinations and sub-combinations of the above technical features, as well as variations and improvements thereof. Those skilled in the art will foresee such combinations, variations and improvements after reading the foregoing description.

In the claims, the term "including" and its variants, such as "comprising", "containing", etc., mean the inclusion of the listed components, without exclusion of other components in general.

What is claimed is:

1. A method for manufacturing a package substrate based on a molding process, the method comprising:
   (a) preparing a temporary carrier plate and fabricating a conductive copper pillar layer on at least one side of the temporary carrier plate;
   (b) manufacturing a first substrate which is a copper substrate comprising a support frame of copper, a base of copper and a copper boss on the base, with through holes formed between the support frame and the base;
   (c) mounting a device on the base;
   (d) assembling and fixing the temporary carrier plate and the first substrate in a mold simultaneously, with the conductive copper pillar layer located in the through holes, and with a lower end surface of the conductive copper pillar layer flush with or higher than an end surface of the copper boss; and applying an encapsulation layer to plastically package the first substrate, the device and the conductive copper pillar layer;
   (e) removing the mold;
   (f) removing the temporary carrier plate;
   (g) thinning the encapsulation layer to expose an end of the conductive copper pillar layer and the end surface of the copper boss;
   (h) forming device terminal openings to expose terminals of the device; and
   (i) forming respectively a first circuit layer and a second circuit layer on upper and lower surfaces of the encapsulation layer, wherein the second circuit layer includes a second conductive circuit and a heat dissipation circuit, the first circuit layer and the second conductive circuit are connected conductively through the conductive copper pillar layer, the heat dissipation circuit is connected to an invalid surface of the device through the copper boss and the base, and the first circuit layer is connected to the terminals of the device.

2. The method of claim 1, wherein the temporary carrier plate includes a copper clad laminate with at least one side cladded with double-layer copper foil, wherein the copper clad laminate includes a core layer, a first copper layer on a surface of the core layer, and a second copper layer on the first copper layer, and wherein the first copper layer and the second copper layer are attached together by physical lamination.

3. The method of claim 1, wherein the step (a) comprises:
   (a1) forming a first metal seed layer on at least one side of the temporary carrier plate;
   (a2) applying a first photoresist layer on the first metal seed layer, and forming a first feature pattern by exposure and development;
   (a3) forming the conductive copper pillar layer by electroplating in the first feature pattern; and
   (a4) removing the first photoresist layer.

4. The method of claim 3, wherein the step (a) further comprises:
   (a0) applying an etch barrier layer on at least one side of the temporary carrier plate.

5. The method of claim 4, wherein the etch barrier layer includes nickel, titanium, or a combination thereof.

6. The method of claim 1, wherein the step (b) comprises:
   (b1) preparing a copper plate;
   (b2) applying respectively a second photoresist layer and a third photoresist layer on upper and lower surfaces of the copper plate, exposing and developing the second photoresist layer to form a second feature pattern, and performing a whole plate exposure of the third photoresist layer;
   (b3) forming a top surface of the base by copper reduction etching in the second feature pattern, and removing the second photoresist layer and the third photoresist layer;
   (b4) applying respectively a fourth photoresist layer and a fifth photoresist layer on the upper and lower surfaces of the copper plate, performing a whole plate exposure of the fourth photoresist layer, and exposing and developing the fifth photoresist layer to form a fifth feature pattern;
   (b5) forming the copper boss by copper reduction etching in the fifth feature pattern, with the copper boss located on a lower surface of the base, and removing the fourth photoresist layer and the fifth photoresist layer; and
   (b6) forming the through holes and the support frame by drilling and milling on both sides of the base, so as to obtain the first substrate.

7. The method of claim 1, wherein the step (b) comprises:
(b1') preparing a copper plate;
(b2') applying respectively a second photoresist layer and a third photoresist layer on upper and lower surfaces of the copper plate, exposing and developing the second photoresist layer to form a second feature pattern, and performing a whole plate exposure of the third photoresist layer;
(b3') forming a top surface of the base by copper reduction etching in the second feature pattern, and removing the second photoresist layer and the third photoresist layer;
(b4') applying respectively a fourth photoresist layer and a fifth photoresist layer on the upper and lower surfaces of the copper plate, performing a whole plate exposure of the fourth photoresist layer, and exposing and developing the fifth photoresist layer to form a fifth feature pattern;
(b5') forming the copper boss by copper reduction etching in the fifth feature pattern, with the copper boss located on a lower surface of the base, and removing the fourth photoresist layer and the fifth photoresist layer; and
(b6') applying respectively an eighth photoresist layer and a ninth photoresist layer on both sides of the base, forming an eighth feature pattern and a ninth feature pattern by respectively exposing and developing, and forming the through holes and the support frame by etching the exposed copper plate in the eighth feature pattern and the ninth feature pattern, so as to obtain the first substrate.

8. The method of claim 1, wherein the step (c) comprises applying a viscous thermally conductive material on the base, and mounting a backside of the device on the viscous thermally conductive material to mount the device on the base.

9. The method of claim 8, wherein the viscous thermally conductive material is selected from at least one of thermally conductive adhesive and silver paste.

10. The method of claim 1, wherein the encapsulation layer is selected from at least one of epoxy resin, phenolic resin, benzocyclobutene resin, and polyesterimide resin.

11. The method of claim 2, wherein the step (f) comprises physically separating the first copper layer and the second copper layer and etching the second copper layer, to remove the temporary carrier plate.

12. The method of claim 1, wherein the step (g) comprises entirely thinning the encapsulation layer by grinding or plasma etching to expose the end of the conductive copper pillar layer and the end surface of the copper boss.

13. The method of claim 1, wherein the step (g) comprises partially thinning the encapsulation layer by laser or drilling to expose the end of the conductive copper pillar layer and the end surface of the copper boss.

14. The method of claim 1, wherein the step (h) comprises partially thinning the encapsulation layer over the terminals of the device by laser, drilling or plasma etching to form the device terminal openings to expose the terminals of the device.

15. The method of claim 1, wherein the step (i) comprises:
(i1) forming respectively a second metal seed layer and a third metal seed layer on the upper and lower surfaces of the encapsulation layer;
(i2) applying respectively a sixth photoresist layer and a seventh photoresist layer on the second metal seed layer and the third metal seed layer, and forming a sixth feature pattern and a seventh feature pattern by exposure and development;
(i3) forming the first circuit layer and the second circuit layer by electroplating respectively in the sixth feature pattern and the seventh feature pattern; and
(i4) removing the sixth photoresist layer and the seventh photoresist layer, and etching the exposed second metal seed layer and the exposed third metal seed layer.

16. The method of claim 1, further comprising:
(j) after the step (i), applying a solder resist material respectively on the first circuit layer and the second circuit layer, and subjecting the exposed metal to surface treatment to form surface treatment layers.

* * * * *